United States Patent
Raj et al.

(10) Patent No.: US 11,495,288 B2
(45) Date of Patent: Nov. 8, 2022

(54) LOW-LEAKAGE SENSE CIRCUIT, MEMORY CIRCUIT INCORPORATING THE LOW-LEAKAGE SENSE CIRCUIT, AND METHOD

(71) Applicant: GLOBALFOUNDRIES U.S. Inc., Malta, NY (US)

(72) Inventors: Vivek Raj, Bangalore (IN); Shivraj G. Dharne, Bangalore (IN); Uttam K. Saha, San Jose, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/143,193

(22) Filed: Jan. 7, 2021

(65) Prior Publication Data
US 2022/0215872 A1 Jul. 7, 2022

(51) Int. Cl.
*G11C 11/419* (2006.01)
*H01L 27/11* (2006.01)
*G11C 11/412* (2006.01)

(52) U.S. Cl.
CPC .......... *G11C 11/419* (2013.01); *G11C 11/412* (2013.01); *H01L 27/1104* (2013.01)

(58) Field of Classification Search
None
See application file for complete search history.

(56) References Cited

U.S. PATENT DOCUMENTS 7,327,598 B2 2/2008 Dang et al.
7,715,221 B2 5/2010 Christensen et al.
8,536,898 B2 9/2013 Rennie et al.
2006/0120144 A1 6/2006 Barth, Jr. et al.
2009/0285046 A1 11/2009 Ehrenreich et al.
2010/0208539 A1* 8/2010 Leomant .............. G11C 5/147
365/226

(Continued)

OTHER PUBLICATIONS

Mittal et al., "Leakage Reduction Using Power Gating Techniques in SRAM Sense Amplifiers", ARPN Journal of Engineering and Applied Sciences 10, pp. 2994-3000.

(Continued)

*Primary Examiner* — James G Norman
(74) *Attorney, Agent, or Firm* — David Cain; Hoffman Warnick LLC

(57) ABSTRACT

A disclosed sense circuit for a memory circuit includes sense amplifiers that detect differences in voltage levels on complementary bitlines during read operations. Instead of the sense amplifiers having built-in footer devices that lead to significant leakage, the sense circuit incorporates a common footer device for all sense amplifiers. To ensure that this footer device has sufficient drive strength to enable voltage differential detection by each sense amplifier, the sense circuit also includes a sense signal generation and boost circuit (SSG&B circuit) that generates a sense mode control signal (SEN) to control the on/off states of the footer device and that further boosts SEN, at the appropriate time, to increase the drive current. By using the common footer device and the SSG&B circuit, leakage from the sense circuit is reduced during a pre-charge operation mode without sacrificing performance during a read operation mode. Also disclosed are associated method embodiments.

15 Claims, 13 Drawing Sheets

(56) References Cited

U.S. PATENT DOCUMENTS

| | | | |
|---|---|---|---|
| 2012/0243359 A1* | 9/2012 | Katoch | G11C 7/08 |
| | | | 365/207 |
| 2016/0172059 A1* | 6/2016 | Arslan | G11C 29/08 |
| | | | 365/148 |
| 2021/0158855 A1* | 5/2021 | Banerjee | G11C 7/106 |

OTHER PUBLICATIONS

Wang et al., "A 1.1GHz 12μA/Mb-Leakage SRAM Design in 65nm Ultra-Low-Power CMOS with Integrated Leakage Reduction for Mobile Applications", IEEE International Solid-State Circuits Conference, 2007, pp. 324-325, 606.

Yamaoka et al., "A 300MHz 25/spl mu/A/Mb Leakage On-Chip SRAM Module Featuring Process-Variation Immunity and Low-Leakage-Active Mode for Mobile-Phone Application Processor", IEEE International Solid-State Circuits Conference, 2004, pp. 1-10.

\* cited by examiner

LOW-LEAKAGE SENSE CIRCUIT, MEMORY CIRCUIT INCORPORATING THE LOW-LEAKAGE SENSE CIRCUIT, AND METHOD

BACKGROUND

Field of the Invention

The present invention relates to sense circuits and, more particularly, to embodiments of a low-leakage sense circuit and a memory circuit that incorporates the low-leakage sense circuit.

Description of Related Art

Memory circuits, such as static random access memory (SRAM) circuits, often use dual-ended sensing for read operations. For example, a memory circuit can include an array of memory cells arranged in columns and rows and a sense circuit. The memory cells in each column can be connected to a pair of complementary bitlines (referred to herein as bitline true (BLT) and bitline complement (BLC)). The sense circuit can include discrete sense amplifiers for each column with each sense amplifier being connected to and receiving inputs from BLT and BLC during a read operation. Specifically, prior to the read operation, BLT and BLC for a column of memory cells are pre-charged. When a selected memory cell in the column is accessed during the read operation, the voltage level on either BLT or BLC will drop and the sense amplifier will detect the differences in the voltage levels on BLT and BLC (i.e., will sense the voltage differential), thereby indicating the stored data value in the memory cell. While current state-of-the-art sense amplifiers provide a solution for sensing voltage differentials between bitlines, they are quite leaky. As a result, when a sense circuit of a memory circuit includes a relatively large number of sense amplifiers, the leakage contribution of the sense circuit to the total memory circuit leakage will be significant (e.g., up to 30% or more).

SUMMARY

Disclosed herein are embodiments of a structure including a low-leakage sense circuit for a memory circuit (e.g., a static random access memory (SRAM) circuit).

In some embodiments, the sense circuit can include multiple sense amplifiers, which are each devoid of a conventional built-in footer device. The sense circuit can further include a common footer device and a sense signal generation and boost (SSG&B) circuit. Specifically, the common footer device can include: a source region, which is, for example, connected to a ground rail or a negative voltage supply rail; a drain region, which is connected to each of the sense amplifiers and, particularly, to pull-down nodes in the sense amplifiers, respectively; and a gate. The SSG&B circuit can have an output node, which is connected to the gate of the footer device. Furthermore, the SSG&B circuit can generate a sense mode control signal on the output node, can apply the sense mode control signal to the gate of the common footer device in order to control the on and off states of the common footer device, and can boost the sense mode control signal once the common footer device has switched to the on-state in order to increase the drive current. By using the common footer device in combination with the SSG&B circuit (instead of leaky built-in footer devices within the sense amplifiers), the leakage from the sense circuit during a pre-charge operation mode is significantly reduced without sacrificing performance during a read operation mode.

In some embodiments, the sense circuit can be configured as described above but can also include a common header device to further reduce leakage. That is, the sense circuit can include multiple sense amplifiers. The sense circuit can further include a common footer device, a common header device, and a sense signal generation and boost (SSG&B) circuit. Specifically, the common footer device can include: a first source region, which is, for example, connected to a ground rail or a negative voltage supply rail; a first drain region, which is connected to each of the sense amplifiers and, particularly, to pull-down nodes in the sense amplifiers, respectively; and a first gate. The common header device can include: a second source region, which is connected to a positive voltage supply rail; a second drain region, which is connected to each of the sense amplifiers such that the sense amplifiers are connected in parallel between the common footer device and the common header device; and a second gate. The SSG&B circuit can have an output node, which is connected to the first gate of the footer device. Furthermore, the SSG&B circuit can generate a sense mode control signal on the output node, can apply the sense mode control signal to the first gate of the common footer device in order to control the on and off states of the common footer device, and can boost the sense mode control signal once the common footer device has switched to the on-state in order to increase the drive current. As mentioned above, by using the common footer device in combination with the SSG&B circuit (instead of leaky built-in footer devices within the sense amplifiers), leakage from the sense circuit during a pre-charge operation mode is significantly reduced without sacrificing performance during a read operation mode. Additionally, by using the common header device, a positive voltage supplied to the sense amplifiers can be selectively turned off (e.g., in response to a sleep mode control signal during a sleep mode) in order to further reduce leakage from the sense circuit.

Also disclosed herein are method embodiments for operating the above-described structures. The method can include providing a structure (e.g., the above-described low-leakage sense circuit or a memory circuit incorporating the above-described low-leakage sense circuit). The sense circuit can include: sense amplifiers; a common footer device comprising: a source region; a drain region connected to each of the sense amplifiers; and a gate; and a sense signal generation and boost (SSG&B) circuit having an output node connected to the gate of the common footer device. The method can further include generating, by the SSG&B circuit, a sense mode control signal. The method can further include applying, by the SSG&B circuit, the sense mode control signal to the gate of the common footer device in order to control on and off states of the common footer device. The method can further include boosting, by the SSG&B circuit, the sense mode control signal when the common footer device is turned on in order to increase the drive current. Optionally, the provided sense circuit can also include a header device. The header device can include: a second source region, which is connected to a positive voltage supply rail; a second drain region, which is connected to each of the sense amplifiers such that the sense amplifiers are connected in parallel between the footer device and the header device; and a second gate. In this case, the method can also include applying a sleep mode control signal to the second gate in order to control the on and off states of the header device. As mentioned above, by using the common footer device in combination with the SSG&B circuit (instead of leaky built-in footer devices within the sense amplifiers), leakage from the sense circuit during a pre-charge operation mode is significantly reduced without sacrificing performance during a read operation mode. Additionally, by using the common header device, a positive voltage supplied to the sense amplifiers can be selectively turned off (e.g., in response to the sleep mode control signal during a sleep mode) in order to further reduce leakage from the sense circuit.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As discussed above, typically when the sense circuit of a memory circuit includes a relatively large number of sense amplifiers, the leakage contribution of the sense circuit to the total memory circuit leakage will be significant (e.g., up to 30% or more).

Figure 1:
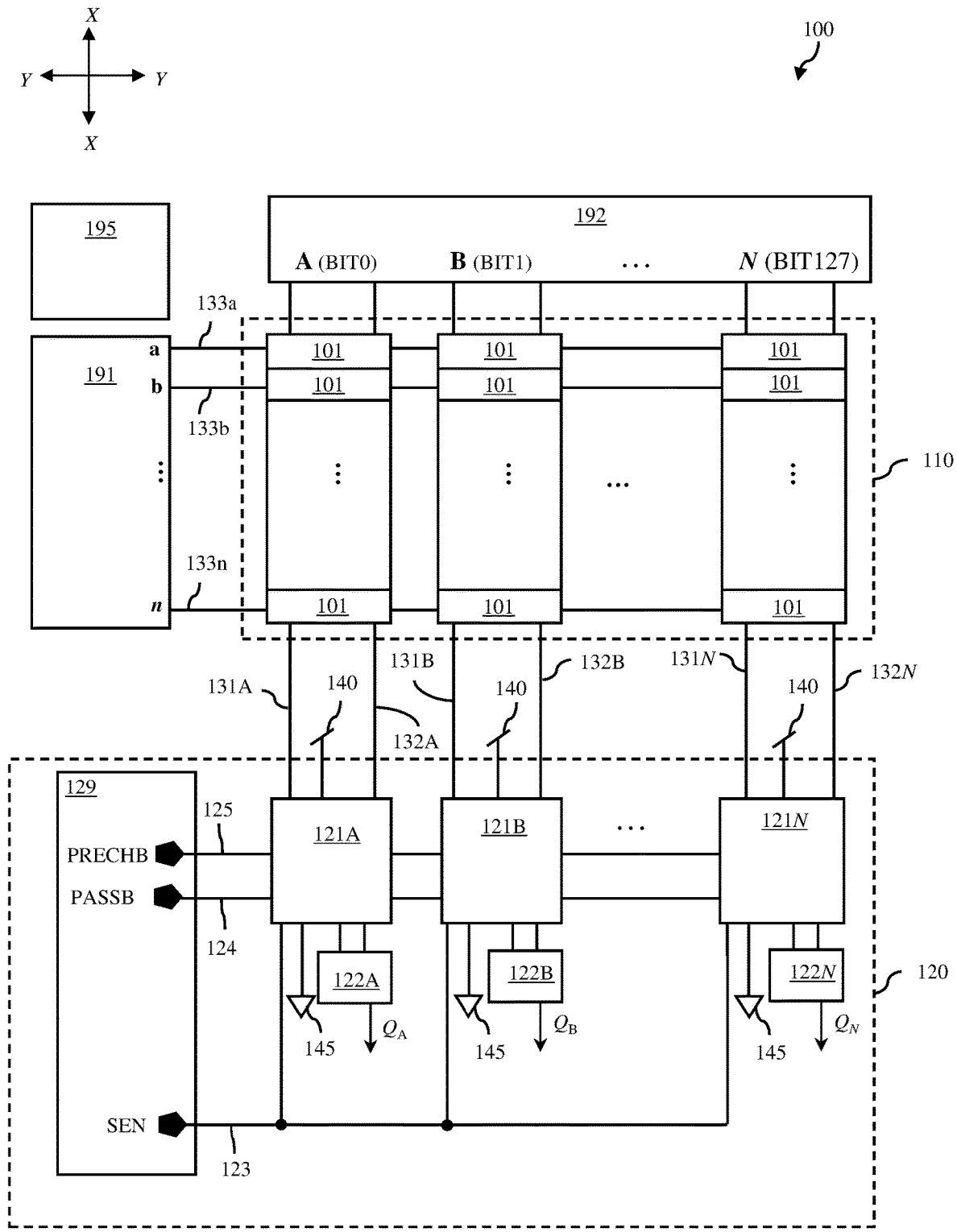
FIG. 1 is a schematic diagram illustrating a memory circuit, such as a static random access memory (SRAM) circuit.

More specifically, FIG. 1 is a schematic diagram illustrating an exemplary memory circuit 100 (e.g., a static random access memory (SRAM) circuit) that includes an array 110 of memory cells 101 (e.g., SRAM cells) arranged in columns A-N and rows a-n. The memory circuit 100 further includes first bitlines 131A-N (also referred to herein as true bitlines (BLTs)) and second bitlines 132A-N (also referred to herein as complement bitlines (BLCs)) for the columns A-N, respectively. Each complementary bitline pair (BLT and BLC) for a column is electrically connected to all of the memory cells 101 in that column. The memory circuit 100 further includes wordlines (WLs) 133a-n for the rows a-n, respectively. Each WL for a row is electrically connected to all of the memory cells 101 in that row. The memory circuit 100 also includes a controller 195 and peripheral circuitry, which is configured to operate in response to control signals from the controller 195. The peripheral circuitry includes a row control block 191, which is electrically connected to the WLs for the rows and which includes, for example, address decode logic and wordline drivers for activating selected wordlines (i.e., for switching selected wordlines from low to high voltage levels) depending upon the mode of operation. The peripheral circuitry also includes a column control block 192, which is electrically connected to BLT and BLC for each of the columns and which includes, for example, column address decode logic and bitline drivers for appropriately biasing selected bitlines depending upon the mode of operation. The peripheral circuitry also includes a sense circuit 120 that enables reading out of stored data from the memory array 110.

Figure 2:
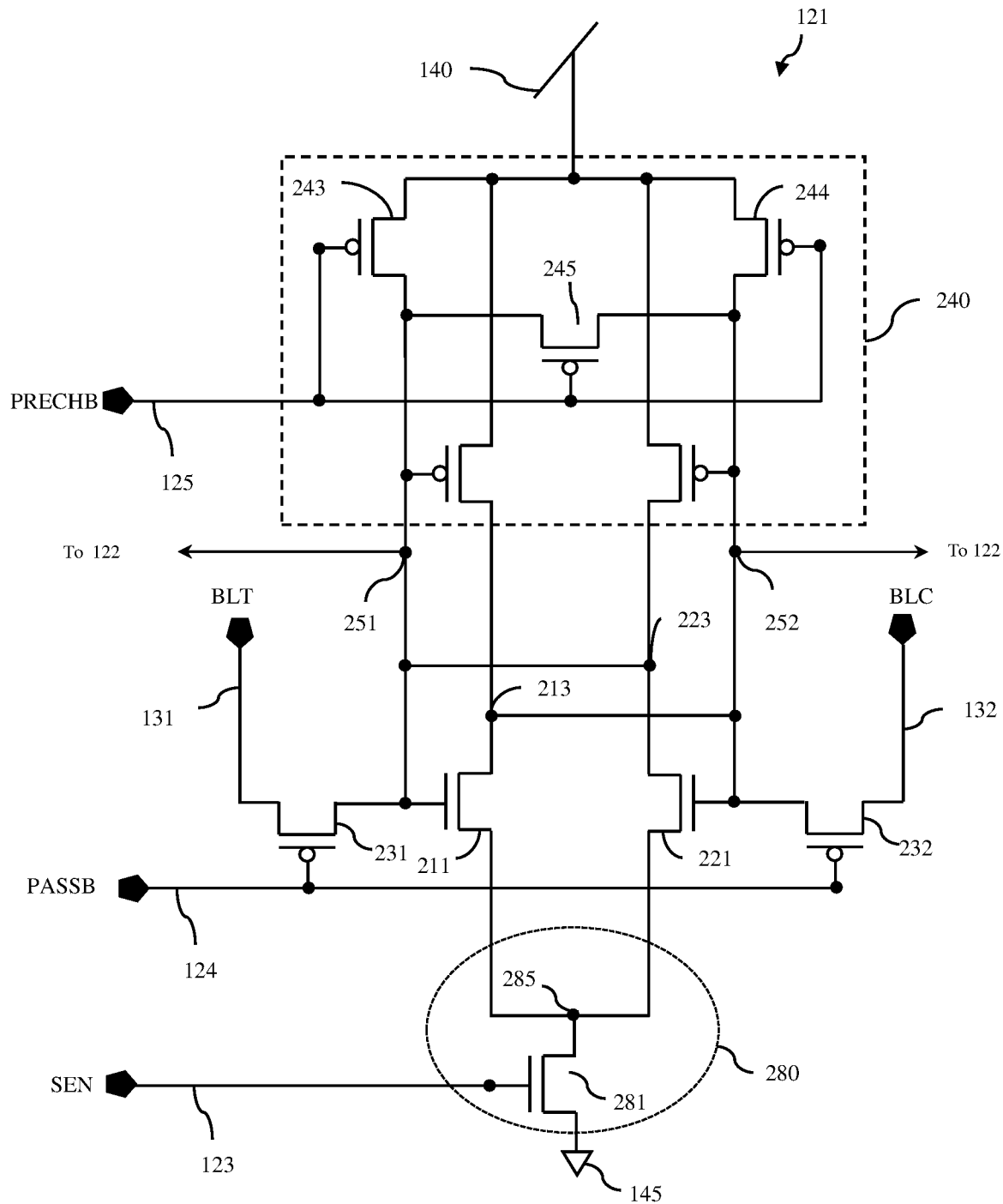
FIG. 2 is a schematic diagram illustrating a sense amplifier that can be incorporated into a sense circuit of the memory circuit of FIG. 1.

The leakage contribution of the sense circuit 120 to the total memory circuit leakage can be significant. For example, the sense circuit 120 includes a sense circuit control block 129, discrete sense amplifiers 121A-121N for the columns, and discrete latches 122A-122N for the sense amplifiers 121A-121N. Prior to a read operation, BLT and BLC for a column of memory cells are pre-charged to a high voltage level. When a selected memory cell in a column is accessed during the read operation, the voltage level on either BLT or BLC will drop depending upon the stored data value. A sense amplifier 121 (e.g., as shown in FIG. 2) which is connected to BLT and BLC, will detect the drop and, particularly, will detect the resulting difference in the voltage levels on BLT and BLC (i.e., the sense amplifier 121 will sense the voltage differential). Then, a latch 122, which has input nodes connected to output nodes 251 and 252, respectively, of the sense amplifier 121 will capture the voltage differential and output an output signal (Q) that indicates the stored data value read from the memory cell. While current state-of-the-art sense amplifiers provide a solution for sensing the voltage differential between BLT and BLC, they are quite leaky.

More specifically, referring to FIG. 2, when a sense amplifier 121 is in a pre-charge operation mode, a pre-charge sub-circuit control signal (PRECHB) 125 will be at a logic "0" (i.e., at a low voltage level, e.g., at ground), an access transistor control signal (PASSB) 124 will be at a logic "1" (i.e., at a high voltage level, e.g., at VDD), a sense mode control signal (SEN) 123 will be at logic "0", and the bitlines (BLT and BLC) can both be at logic "1". As a result, p-type field effect transistors (PFETs) 243-245 of a pre-charge sub-circuit 240 within the sense amplifier 121 will be in an on-state. Additionally, PFETs 231 and 232, which each function as pass-gates, and a N-type FET 281 (NFET), which is a built-in footer device 280, will all be in off-states. However, two discrete leakage current paths will still exist within this sense amplifier 121. The first leakage current path is from a positive voltage supply rail 140 (e.g., at VDD) through the PFET 243 in the pre-charge sub-circuit 240 to a first cross-couple node 223, through an NFET 221, through a pull-down node 285 and, finally, through the NFET 281 to a ground rail 145. The second leakage current path is from the positive voltage supply rail 140 (e.g., at VDD) through the PFET 244 in the pre-charge sub-circuit 240 to a second cross-couple node 213, through an NFET 211, through the pull-down node 285 and, finally, through the NFET 281 to the ground rail 145. As a result, when the sense circuit 120 includes a relatively large number of sense amplifiers (e.g., 128 sense amplifiers for a 128-bit memory array), the leakage contribution of the sense circuit to the total memory circuit leakage will be up to 30% or more.

Figure 3:
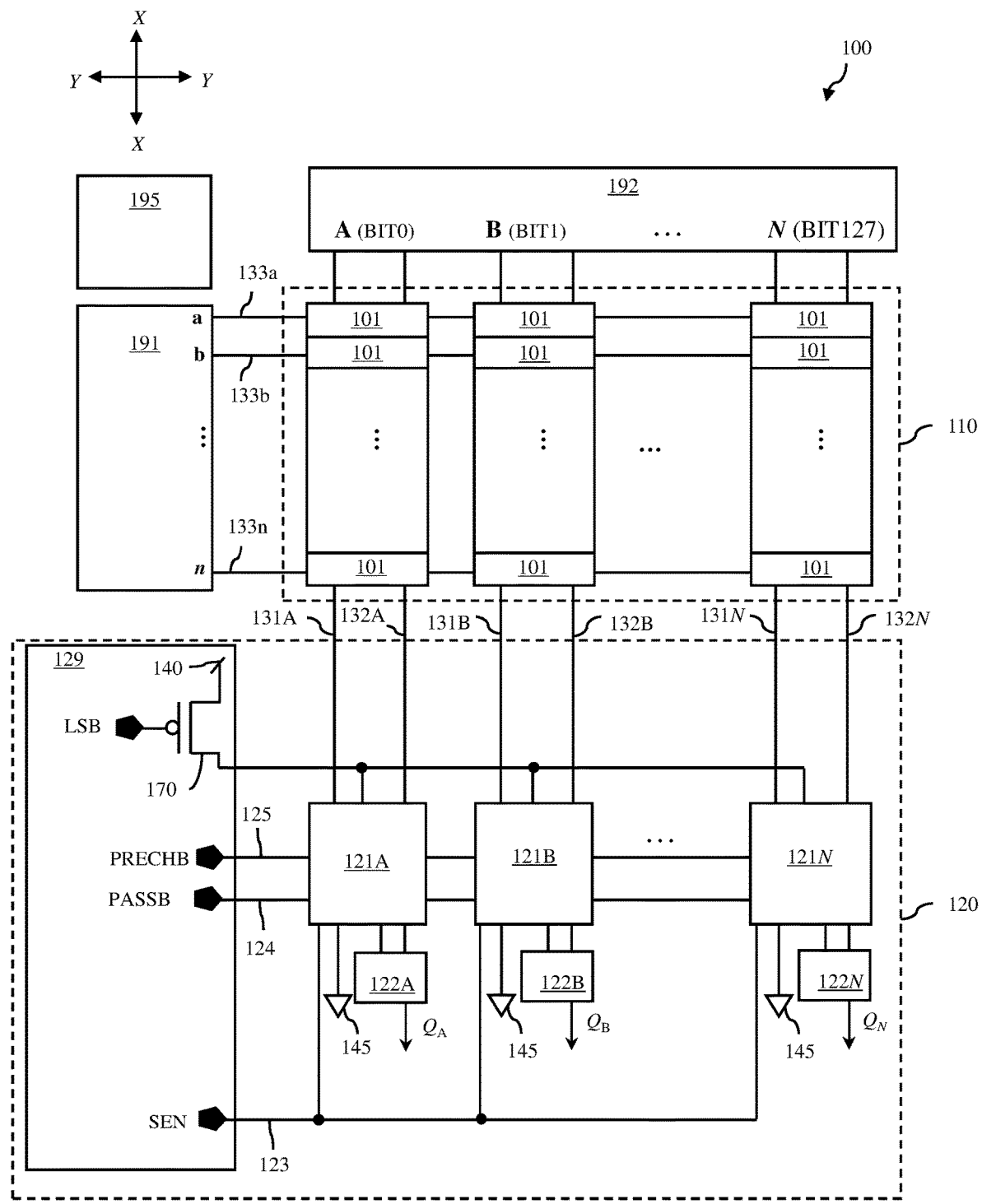
FIG. 3 is a schematic diagram of a memory circuit (e.g., an SRAM circuit) configured for light sleep mode operation to limit the leakage contribution of the sense circuit.
Figure 4:
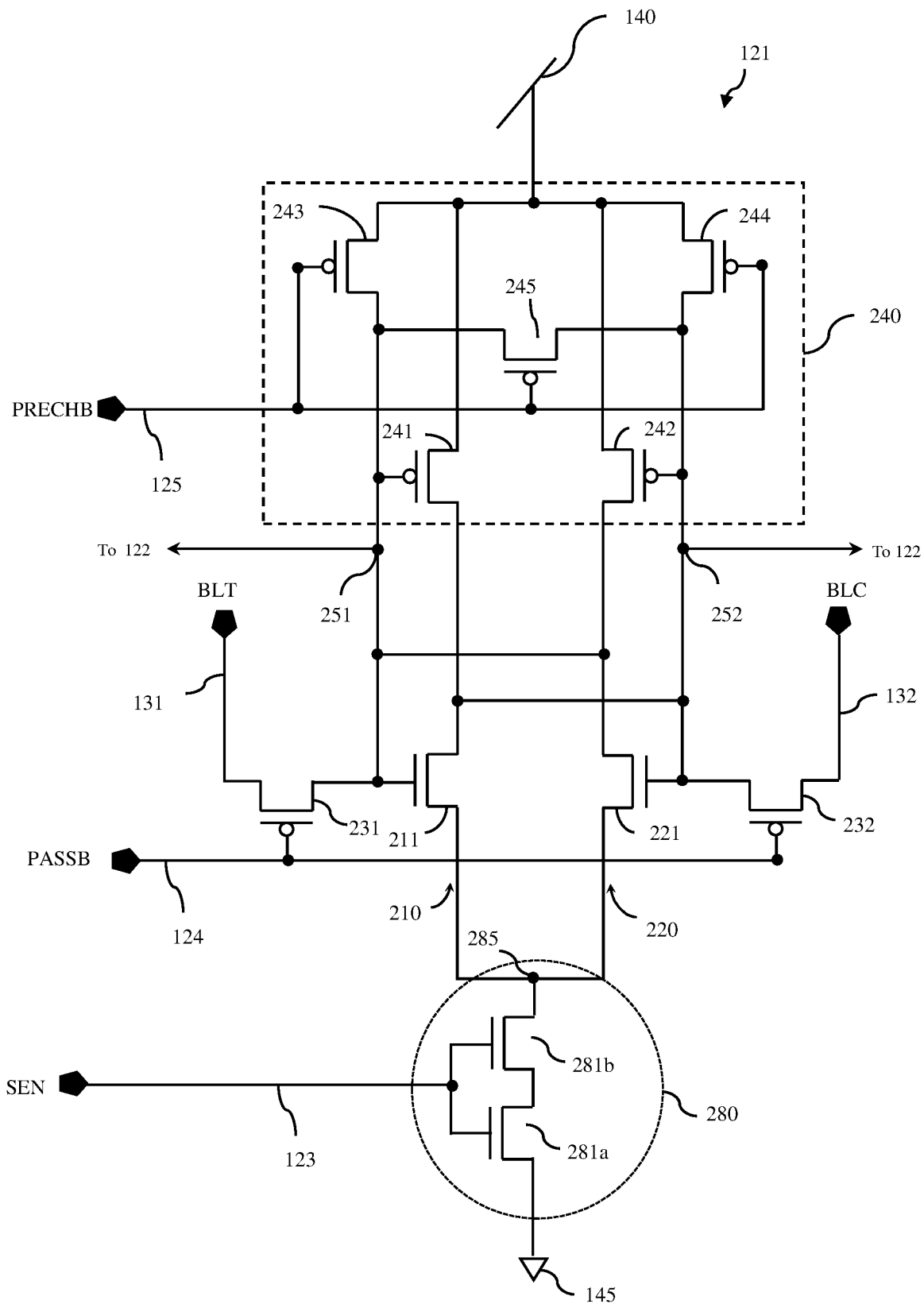
FIG. 4 is a schematic diagram of a sense amplifier configured with a built-in footer device having stacked NFETs to reduce the leakage contribution of the sense circuit.

One technique used to limit the leakage contribution of the sense circuit 120 includes configuring the sense circuit so that, when the memory circuit 100 is idle for some predetermined significant period of time and, thus, enters a light sleep mode, the sense circuit 120 also enters a light sleep mode. For example, as illustrated in FIG. 3, instead of being directly connected to the positive voltage supply rail 140, each sense amplifier 121A-121N can be connected to the positive voltage supply rail 140 through a header device 170 (e.g., a PFET) in the sense circuit control block 129. The header device 170 can be controlled by a sleep mode control signal (LSB). When the memory circuit 100 is in an idle mode for an extended period of time and enters a light sleep mode, LSB can switch to logic "1", thereby turning off the header device 170 and concurrently blocking the leakage current paths through each of the sense amplifiers. This solution reduces the leakage contribution of the sense circuit 120. However, the reduction in leakage current is limited because the leakage current paths are only blocked when the memory circuit 100 enters the light sleep mode and not when it is in an active mode (e.g., in the pre-charge operation mode). Another technique used to limit the leakage contribution of the sense circuit 120 includes configuring each sense amplifier 121 so that the built-in footer device 280 includes multiple stacked NFETs (e.g., see NFETs 281a-282b, as shown in FIG. 4). This solution increases chip area consumption and may not sufficiently block leakage current during the pre-charge operation mode.

In view of the foregoing, disclosed herein are embodiments of a low-leakage sense circuit for a memory circuit, such as a static random access memory (SRAM) circuit. The sense circuit can include sense amplifiers for detecting differences in voltage levels on complementary bitlines during read operations. However, instead of the sense amplifiers having built-in footer devices that lead to significant leakage (as discussed above), the sense circuit incorporates a common footer device for all of the sense amplifiers, thereby reducing leakage. To ensure that the common footer device has the drive strength to adequately enable voltage differential detection by each sense amplifier, the sense circuit can also include a sense signal generation and boost circuit (SSG&B circuit). This SSG&B circuit can generate a sense mode control signal that controls the on and off states of the footer device and can also boost the sense mode control signal, at the appropriate time, in order to increase the drive current. By using the common footer device in combination with the SSG&B circuit (instead of leaky built-in footer devices within the sense amplifiers), leakage from the sense circuit is significantly reduced during a pre-charge operation mode without sacrificing performance during a read operation mode. Also disclosed herein are associated method embodiments.

Figure 5A:
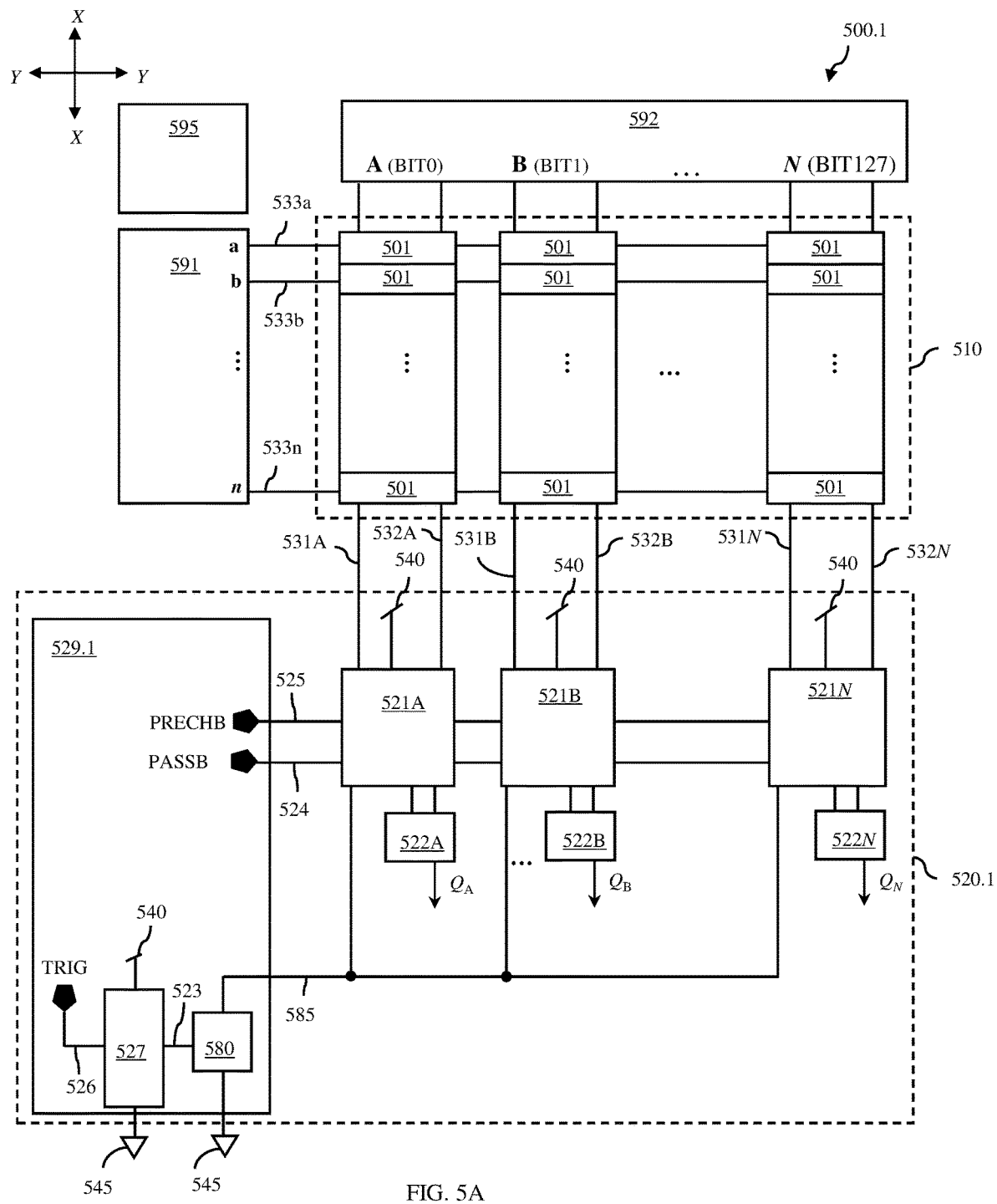
FIGS. 5A and 5B are schematic diagrams illustrating disclosed embodiments of a memory circuit, respectively, and further illustrating disclosed embodiments of a low-leakage sense circuit that can incorporated into the memory circuit embodiments.
Figure 5B:
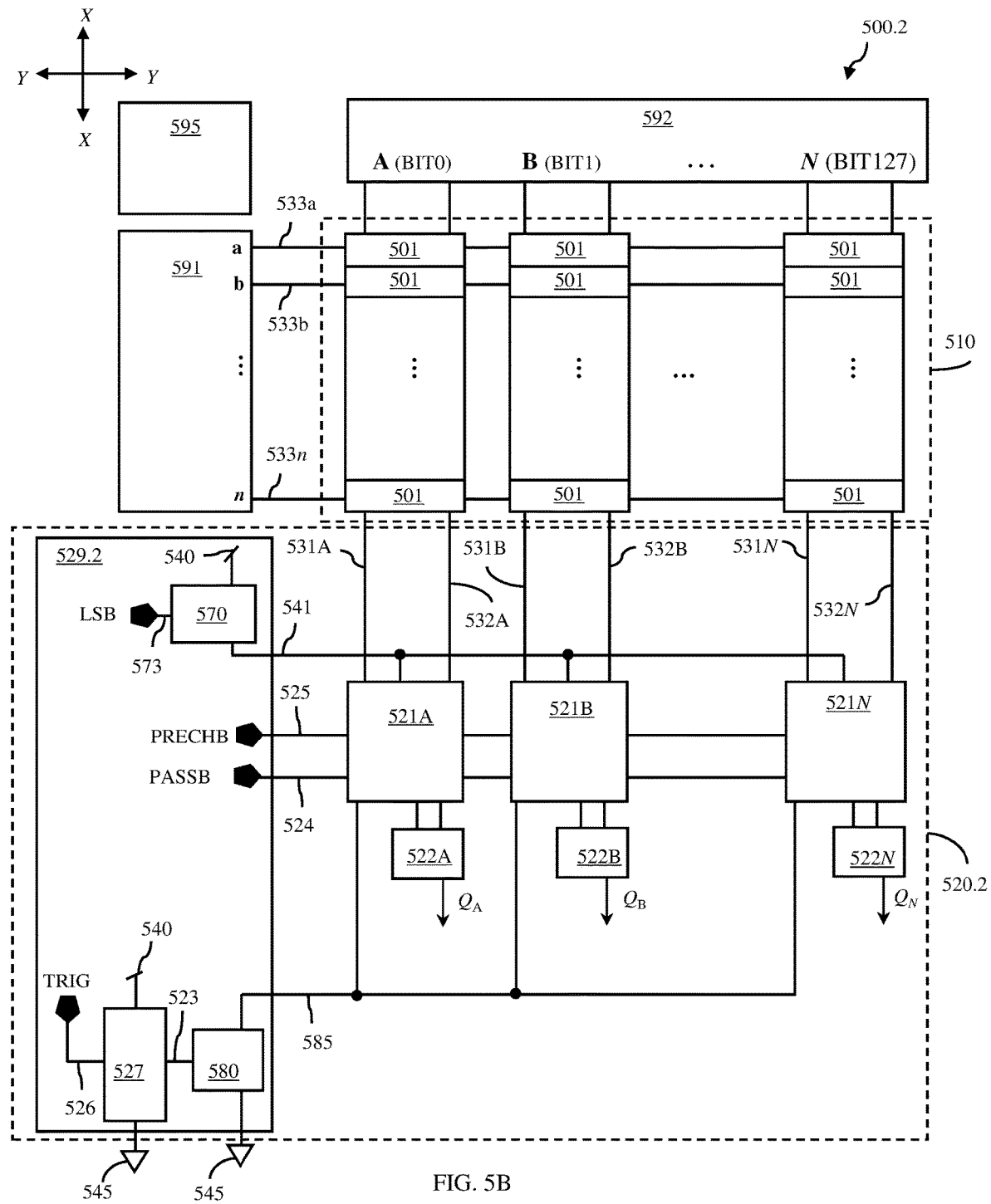

More particularly, referring to FIGS. 5A and 5B, disclosed herein are embodiments of several structures including embodiments of a low-leakage sense circuit 520.1, 520.2 and embodiments of a memory circuit 500.1, 500.2 that incorporates such a low-leakage sense circuit 520.1, 520.2.

The memory circuit 500.1, 500.2 can be, for example, a static random access memory (SRAM) circuit or any other suitable memory circuit that employs a sense circuit 520.1, 520.2 with sense amplifiers for detecting differences in voltage levels on complementary bitlines during read operations. Specifically, the memory circuit 500.1, 500.2 can include an array 510 of memory cells 501, which are arranged in columns A-N and rows a-n. The memory circuit 500 can further include at least a complementary bitline pair for each column (i.e., a bitline true (BLT) and a bitline complement (BLC) for each column). For example, see BLT 531A and BLC 532A for column A, BLT 531B and BLC 532B for column B, and so on. The memory circuit 500 can further include at least one wordline (WL) for each row. For example, see WL 533a for row a, WL 533b for row b, and so on. Those skilled in the art will recognize that the total number of bitlines per column and the total number of wordlines per row will depend upon the type of SRAM cells employed.

Figure 6:
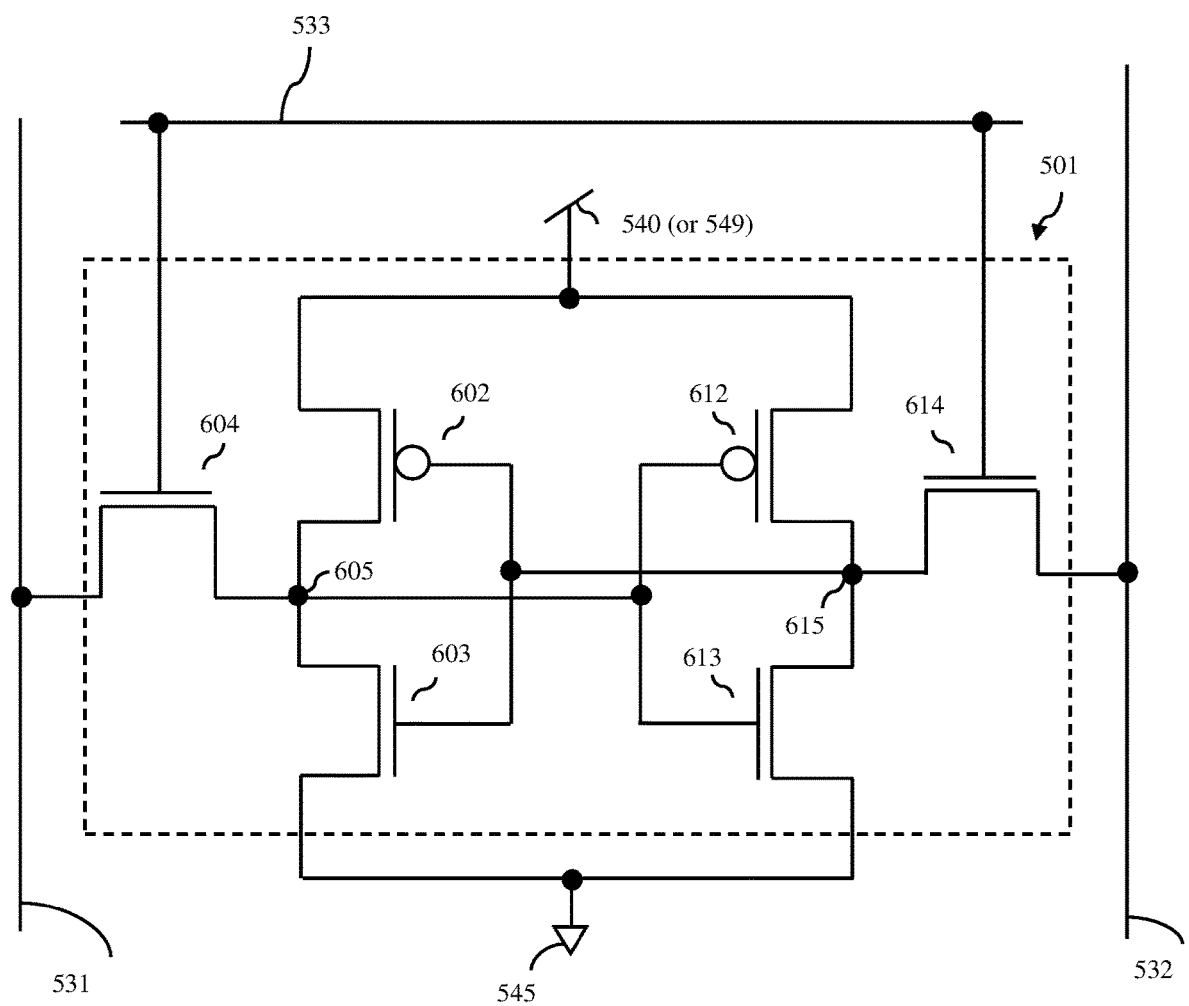
FIG. 6 is a schematic diagram illustrating an exemplary six-transistor (6T) SRAM cell that can be incorporated into the memory array of the disclosed memory circuit embodiments.

For purposes of illustration, the memory cells 501 are described below and illustrated in the drawings as being six-transistor (6T) SRAM cells. As illustrated in FIG. 6, a 6T-SRAM cell 501 can include: two pass-gate transistors (e.g., two N-type field effect transistors (NFETs)); two pull-up transistors (e.g., two P-type field effect transistors (PFETs)); and two pull-down transistors (e.g., two additional NFETs). Specifically, a 6T-SRAM cell 501 can include a first inverter and a second inverter. The first inverter can include a first pull-up transistor 602 (e.g., a PFET) and a first pull-down transistor 603 (e.g., an NFET) connected in series between a positive voltage supply rail and a ground or negative voltage supply rail. It should be noted that, depending on the configuration of the memory circuit 500, the positive voltage supply rail can be at the same positive voltage level (e.g., VDD 540) used to power the peripheral circuitry of the memory circuit 500.1, 500.2 or at a higher voltage level (e.g., VCS 549) used to power the memory cells only. In any case, the second inverter can include a second pull-up transistor 612 (e.g., another PFET) and a second pull-down transistor 613 (e.g., another NFET) connected in series between the same voltage rails. The first and second inverters can be cross-coupled. That is, the gates of the second pull-up transistor 612 and the second pull-down transistor 613 can be connected to a first data node 605, which is a junction between the first pull-up transistor 602 and the first pull-down transistor 603. Additionally, the gates of the first pull-up transistor 602 and the first pull-down transistor 603 can be connected to a second data node 615, which is at the junction between the second pull-up transistor 612 and the second pull-down transistor 613. The 6T-SRAM cell 501 can also include a pair of pass-gate transistors (e.g., NFETs) including a first pass-gate transistor 604, which is connected in series between a BLT 531 for a column and the first data node 605, and a second pass-gate transistor 614, which is connected in series between BLC 532 for the same column and the second data node 615. The gates of the first and second pass-gate transistors 604, 614 can be connected to the WL 533 for a particular row.

Those skilled in the art will recognize that such a 6T SRAM cell 501 can operate in three different modes:

standby, write and read. In the standby mode, the cell is idle. In the write mode, a data value is written into the cell. Specifically, if a data value of "1" (i.e., a high data value) is to be written to the first data node 605, BLC 532 is set at a first or low voltage level (e.g., discharged to ground (GND)) and BLT 531 is charged to a second voltage level (e.g., VDD) that is greater than the first voltage level. WL 533 is activated (i.e., switch from the first voltage level to the second voltage level) in order to turn on the first and second pass-gate transistors 604 and 614, thereby storing the data value of "1" on the first data node 605. Contrarily, if a data value of "0" (i.e., a low data value) is to be written to the first data node 605, BLT 531 is discharged and BLC 532 is charged to the second voltage level. Then, the WL 533 is activated in order to turn on the first and second pass-gate transistors 604 and 614, thereby storing the data value of "0" on the first data node 605. In the read mode, a stored data value on the first data node 605 in the cell is read out. Specifically, BLT 531 and BLC 532 are both pre-charged to the second voltage level and WL 533 is activated in order to turn on the first and second pass-gate transistors 604 and 614. When a data value of "1" is stored on the first data node 605, BLT 531 will remain charged at its pre-charge voltage level and the voltage level on BLC 532 will be pulled down through the second pass-gate transistor 614 and the second pull-down transistor 613. When a data value of "0" is stored on the first data node 605, the voltage level on BLT 531 will be pulled down through the first pass-gate transistor 604 and the first pull-down transistor 603 and BLC 532 will remain charged at its pre-charge voltage level. As discussed in greater detail below with regard to the low-leakage sense circuit 520, a sense amplifier, which is connected to BLT and BLC for the column containing a selected memory cell being read, will detect differences in the voltage levels on BLT and BLC (i.e., will sense the voltage differential) and a latch, which is connected to the sense amplifier, will capture this voltage differential and output an output signal (Q) that indicates the stored data value from the selected memory cell.

The description of the 6T-SRAM cell set forth above is offered for illustration purposes and is not intended to be limiting. It should be understood that memory cells 501 that are incorporated into the memory array 510 could, alternatively, be 6T SRAM cells with a different configuration, different types of SRAM cells (e.g., eight transistor (8T) SRAM cells, ten transistor (10T) SRAM cells, etc.) or different types of memory cells that similarly require the use of a sense amplifier to detect a voltage differential on a complementary bitline pair during a read operation.

The memory circuit 500.1, 500.2 can further include a controller 595 and peripheral circuitry, which is configured to operate in response to control signals from the controller 595. Specifically, the peripheral circuitry can include a row control block 591, which can be connected to the wordlines for the rows and which can include, for example, address decode logic and wordline drivers for activating selected wordlines (i.e., for switching selected wordlines from low to high voltage levels) depending upon the mode of operation. The peripheral circuitry can include a column control block 592, which is electrically connected to the bitlines for the columns and which can include, for example, column address decode logic and bitline drivers for appropriately biasing selected bitlines depending upon the mode of operation. The peripheral circuitry can also include a sense circuit 520.1, 520.2 that is configured, as discussed in greater detail below, to enable reading out of stored data from the memory array 510. Controllers, row control blocks and column control blocks employed for memory array operation are well known in the art. Thus, the details thereof have been omitted from this specification in order to allow the reader to focus on the salient aspects of the disclosed embodiments specifically related to the low-leakage sense circuit 520.1, 520.2, as discussed below.

The low-leakage sense circuit 520.1, 520.2, like prior art sense circuits, can include sense amplifiers for the columns, respectively (e.g., see sense amplifier 521A for column A, sense amplifier 521B for column B, and so on); latches for the sense amplifiers, respectively (e.g., see latch 522A for sense amplifier 521A, latch 522B for sense amplifier 521B, and so on) and a sense circuit control block 529, which is configured to facilitate reading out of a stored data value from a selected memory cell in response to various control signals (including, but not limited to, a pre-charge circuit control signal (PRECHB), an access transistor control signal (PASSB) and a sense mode trigger signal (TRIG)) from the controller 595). However, unlike prior art sense circuits, each sense amplifier in the low-leakage sense circuit 520.1, 520.2 disclosed herein can specifically be devoid of a conventional built-in footer device. Instead the sense circuit control block 529.1, 529.2 can include a common footer device 580 and additional circuitry (specifically a sense signal generation and boost (SSG&B) circuit 527) to compensate for the lack of footer devices within each sense amplifier.

Figure 7:
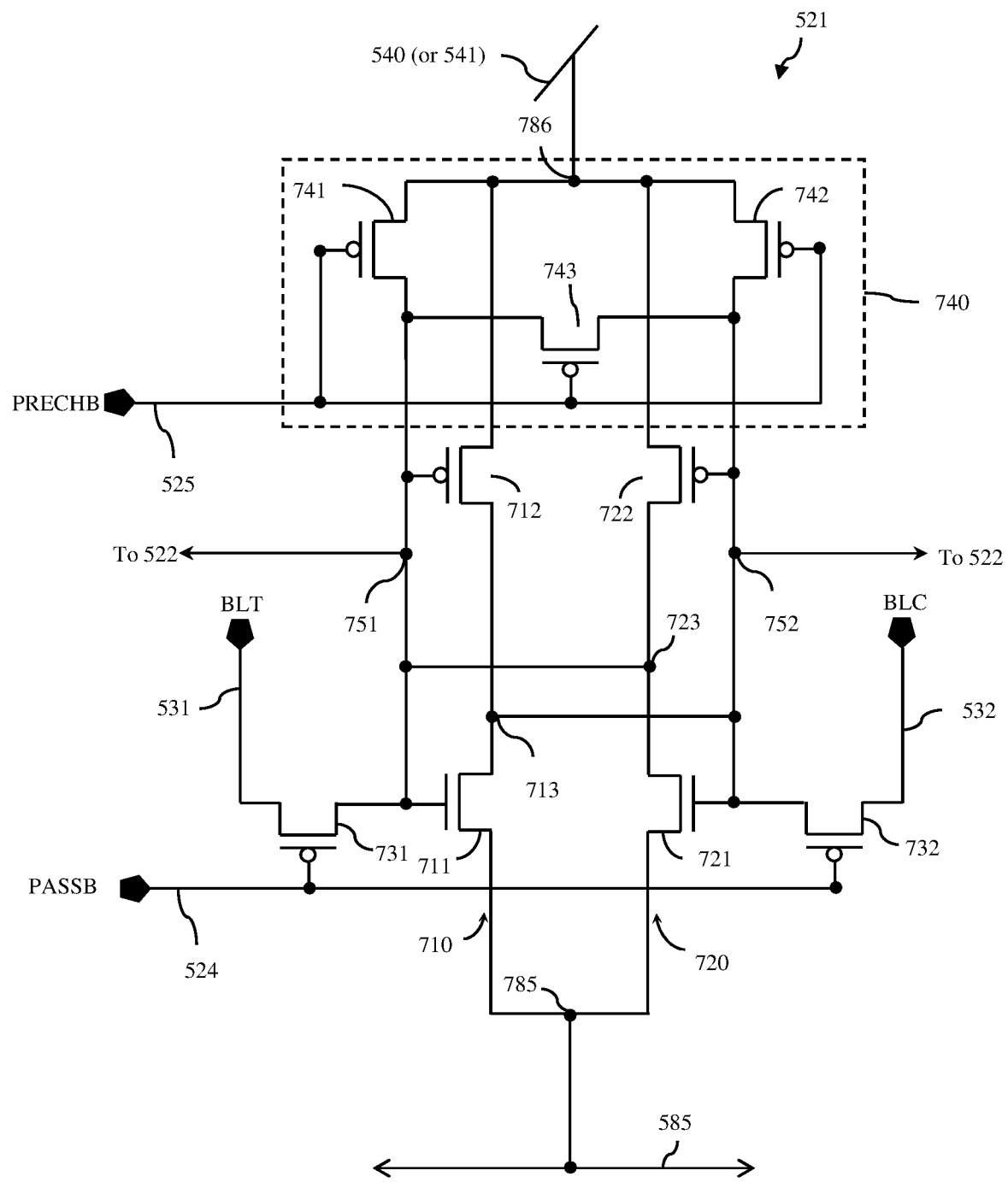
FIG. 7 is a schematic diagram illustrating a disclosed embodiment of a sense amplifier that is devoid of a built-in footer device and that can be incorporated into the disclosed sense circuit embodiments.

FIG. 7 is a schematic diagram illustrating one exemplary sense amplifier 521 that can be incorporated into the sense circuit 520.1, 520.2. As illustrated, the sense amplifier 521 can have a pull-down node 785 and the pull-down nodes of all of the sense amplifiers in the sense circuit 520.1, 520.2 can be electrically connected to a common voltage pull-down line 585 (as opposed to being electrically connected via a built-in footer device to a voltage rail 545, such as a ground rail or negative voltage supply rail). The remaining circuitry of the sense amplifier 521 can have any suitable configuration sufficient to detect a voltage differential on a complementary bitline pair.

For example, as shown in FIG. 7, the sense amplifier 521 can include a first leg 710 (referred to herein as a data leg) and a second leg 720 (referred to herein as a reference leg). The first leg 710 can include a first pull-up transistor 712 (e.g., a PFET) and a first pull-down transistor 711 (e.g., an NFET) connected in series between a pull-up node 786 and the pull-down node 785. The second leg 720 can include a second pull-up transistor 722 (e.g., a PFET) and a second pull-down transistor 721 (e.g., an NFET) connected in series between the pull-up node 786 and the pull-down node 785.

The sense amplifier 521 can further include a pair of access transistors 731 and 732. A first access transistor 731 (e.g., a PFET) can have one source/drain region connected to BLT 531 for a column and another source/drain region connected to the gate of the first pull-down transistor 711, to the gate of the first pull-up transistor 712, to a first output node 751, to a cross-coupling node 723 at a junction node between the second pull-up transistor 722 and the second pull-down transistor 721, and to a pre-charge sub-circuit 740. A second access transistor 732 (e.g., a PFET) can have one source/drain region connected to BLC 532 for the column and another source/drain region connected to the gate of the second pull-down transistor 721, to the gate of the second pull-up transistor 722, to a second output node 752, to a cross-coupling node 713 at a junction between the first pull-up transistor 712 and the first pull-down transistor 711, and to the pre-charge sub-circuit 740. The on and off states of the first and second access transistors 731 and 732 can be controlled by an access transistor control signal (PASSB) 524 from the controller 595 or the sense circuit control block 529.1, 529.2 (as illustrated in FIGS. 5A and 5B).

The pre-charge sub-circuit 740 can include three pre-charge transistors (e.g., PFETs) 741-743. A first pre-charge transistor 742 can be connected in series between the pull-up node 786 and the first access transistor 731. A second pre-charge transistor 742 can be connected in series between the pull-up node 786 and the second access transistor 732. A third pre-charge transistor 743 can have one source/drain region connected to a junction between the first pre-charge transistor 741 and the first access transistor 731 and another source/drain region connected to a junction between the second pre-charge transistor 742 and the second access transistor 732. The on and off states of the three pre-charge transistors 741-743 can be concurrently controlled by a pre-charge sub-circuit control signal (PRECHB) 525 from the controller 595 or the sense circuit control block 529.1, 529.2 (as illustrated in FIGS. 5A and 5B).

Within the sense circuit 520.1, 520.2 of the memory circuit 500.1, 500.2, the pull-down nodes 785 of the sense amplifiers can be electrically connected to a common voltage pull-down line 585 and this common voltage pull-down line 585 can be electrically connected to the sense circuit control block 529.1, 529.2. In some embodiments, within the sense circuit 520.1 (e.g., see FIG. 5A), the pull-up nodes of the sense amplifiers can be directly connected to an additional voltage rail and, particularly, a positive voltage supply rail 540. In other embodiments, within the sense circuit 520.2 (e.g., see FIG. 5B), the pull-up nodes 786 of the sense amplifiers can be electrically connected to a common voltage pull-up line 541 and this common voltage pull-up line 541 can be electrically connected to the sense circuit control block 529.2.

In any case, within each sense amplifier 521 as shown in FIG. 7, the first output node 751 and the second output node 752 can be electrically connected to a first input node and a second input node, respectively, of a corresponding latch 522.

Figure 8A:
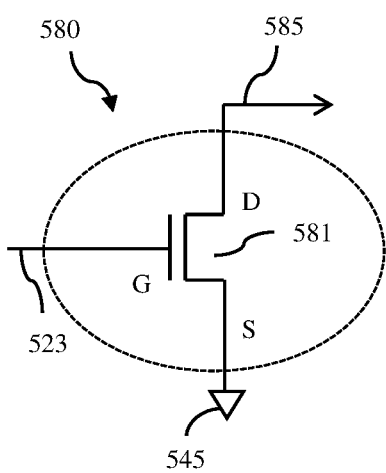
FIGS. 8A and 8B are schematic diagrams illustrating different common footer devices, respectively, that could be incorporated into the sense circuit control block of the disclosed sense circuit embodiments.
Figure 8B:
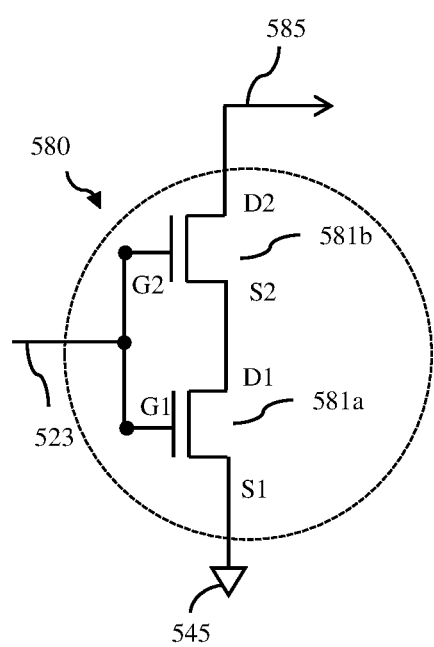

The sense circuit control block 529.1, 529.2 can include a common footer device 580, which is electrically connected to the common voltage pull-down line 585. The common footer device 580 can be, for example, a single NFET device 581, as shown in FIG. 8A. Alternatively, the common footer device 580 can include multiple stacked NFETs (e.g., 581a-581b) with a shared gate, as shown in FIG. 8B. In any case, the common footer device 580 can include: a source region, which is, for example, connected to a voltage rail 545 (e.g., a ground rail or a negative voltage supply rail); a drain region, which is connected to the common voltage pull-down line 585 and, thereby to the pull-down node 785 in each sense amplifier; and a gate. When the common footer device 580 is turned on, the voltage levels on the pull-down nodes of all the sense amplifiers will be concurrently pulled down through the common voltage pull-down line 585 and the common footer device 580 (e.g., during a read operation, as discussed in greater detail below). When the common footer device 580 is turned off, the voltage levels on the pull-down nodes should remain constant (e.g., during a pre-charge operation mode, as discussed in greater detail below).

The sense circuit control block 529.1, 529.2 can also include a sense signal generation and boost (SSG&B) circuit 527. The SSG&B circuit 527 can be electrically connected to the gate of the common footer device 580 and can be configured to generate a sense mode control signal (SEN) 523, to apply SEN 523 to the gate of the common footer device 580 in order to control the on and off states of the common footer device 580, and to boost SEN 523 when the common footer device 580 has switched to the on-state in order to increase the drive current of the common footer device 580 so that, in each sense amplifier, the voltage level on one of the output nodes can be sufficiently pulled down through its pull-down node, the common voltage pull-down line 585 and the common footer device 580 in order to facilitate detection of the voltage differential in the complementary bitline pair and avoid a read fail.

Figure 9:
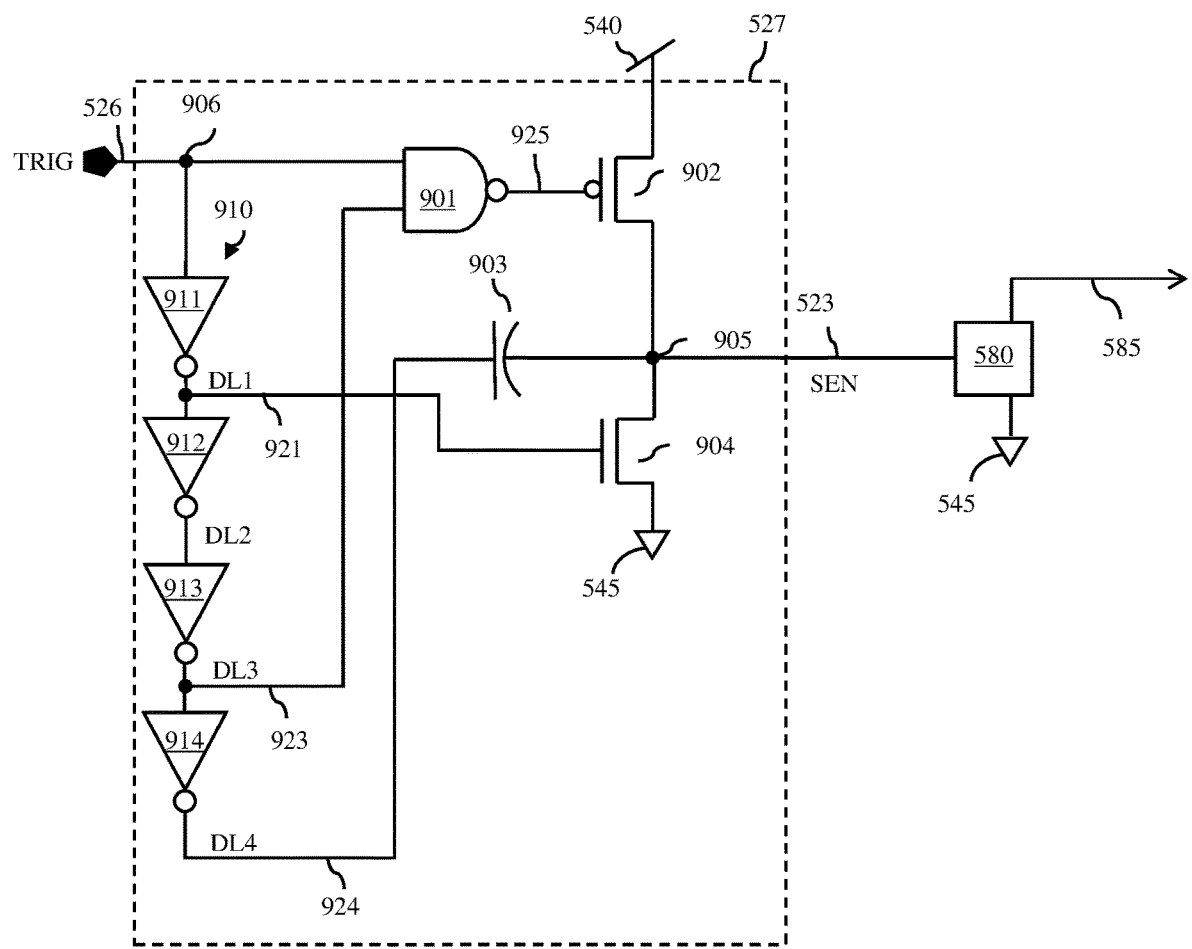
FIG. 9 is a schematic diagram illustrating an embodiment of a sense signal generation and boost (SSG&B) circuit that could be incorporated into the sense circuit control block of the disclosed sense circuit embodiments.

FIG. 9 is a schematic diagram illustrating an exemplary SSG&B circuit 527 that can be incorporated into the sense control block 529.1, 529.2. This SSG&B circuit 527 can include an input node 906, which receives a sense mode trigger signal (TRIG) 526 (e.g., from the controller 595).

The SSG&B circuit 527 can further include a delay circuit 910. The delay circuit 910 can include four series-connected inverter delay elements 911-914 and, particularly, a first inverter 911 that receives TRIG 526 from the input node 906 and outputs a first delay signal 921 (DL1); a second inverter 912 that receives DL1 921 and outputs a second delay signal (DL2); a third inverter 913 that receives DL2 and outputs a third delay signal (DL3) 923; and a fourth inverter 914 that receives DL3 923 and that outputs a fourth delay signal (DL4) 924.

The SSG&B circuit 527 can further include a coupling capacitor 903. The delay circuit 910 and this coupling capacitor 903 can be connected in series between the input node 906 and an output node 905.

The SSG&B circuit 527 can further include a NAND gate 901. The NAND gate 901 can receive, as inputs, TRIG 526 from the input node 906 and DL3 923 from the third inverter 913 of the delay circuit 910. The NAND gate 901 can further output a sense pull-up signal (SPU) 925 according to a conventional NAND gate truth table. That is, SPU 925 will be at a logic "1" except when both TRIG 526 and DL3 923 are at logic "1" causing SPU 925 to switch to a logic "0".

The SSG&B circuit 527 can further include a PFET 902 and an NFET 904, which are connected in series between a positive voltage supply rail 540 and another voltage rail 545 (e.g., a ground rail or a negative voltage supply rail). The NAND gate 901 can apply SPU 925 to the gate of the PFET 902 to control the on and off states of the PFET 902. The first inverter 911 can apply DL1 921 from the first inverter 911 of the delay circuit 910 to the gate of the NFET 904 to control the on and off states of the NFET 904. As illustrated, the output node 905 of the SSG&B circuit 527 can be at the junction between the PFET 902 and the NFET 904 and can output SEN 523 to the gate of the common footer device 580 to control the on and off states of the common footer device 580.

Figure 10A:
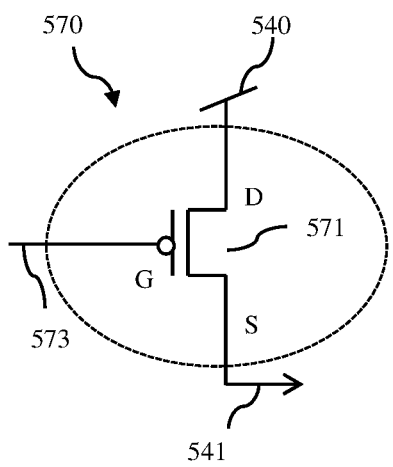
FIGS. 10A and 10B are schematic diagrams illustrating different common header devices, respectively, that could be incorporated into the sense circuit control block of the disclosed sense circuit embodiments.
Figure 10B:
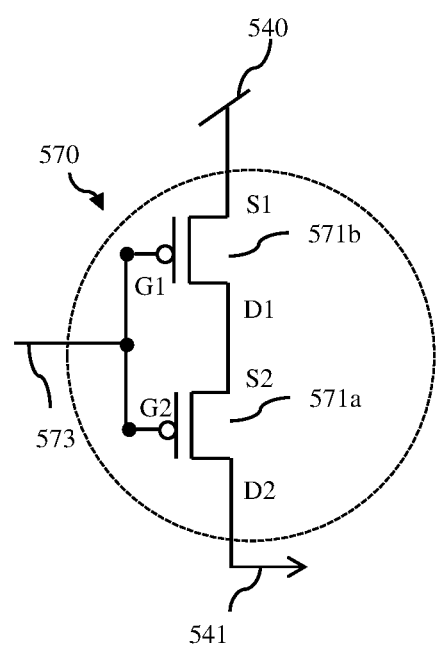

As mentioned above, in some embodiments, within the sense circuit 520.2 (see FIG. 5B), the pull-up nodes 786 of the sense amplifiers 521A-N can be electrically connected to a common voltage pull-up line 541 and this common voltage pull-up line 541 can be electrically connected to a common header device 570 within the sense circuit control block 529.2. The common header device 570 can be, for example, a single PFET device 571, as shown in FIG. 10A. Alternatively, the common header device 570 can include multiple stacked PFETs (e.g., 571a-571b) with a shared gate, as shown in FIG. 8B. In any case, the common header device 570 can include: a second source region, which is connected to a positive voltage supply rail 540 (e.g., at VDD); a second drain region, which is connected to each of the sense amplifiers such that the sense amplifiers are connected in parallel between the common footer device 580 and the common header device 570; and a second gate. The on and off states of the common header device 570 can be controlled by sleep mode control signal (LSB) 573 from the controller 595 or the sense circuit control block 529.

Figure 11:
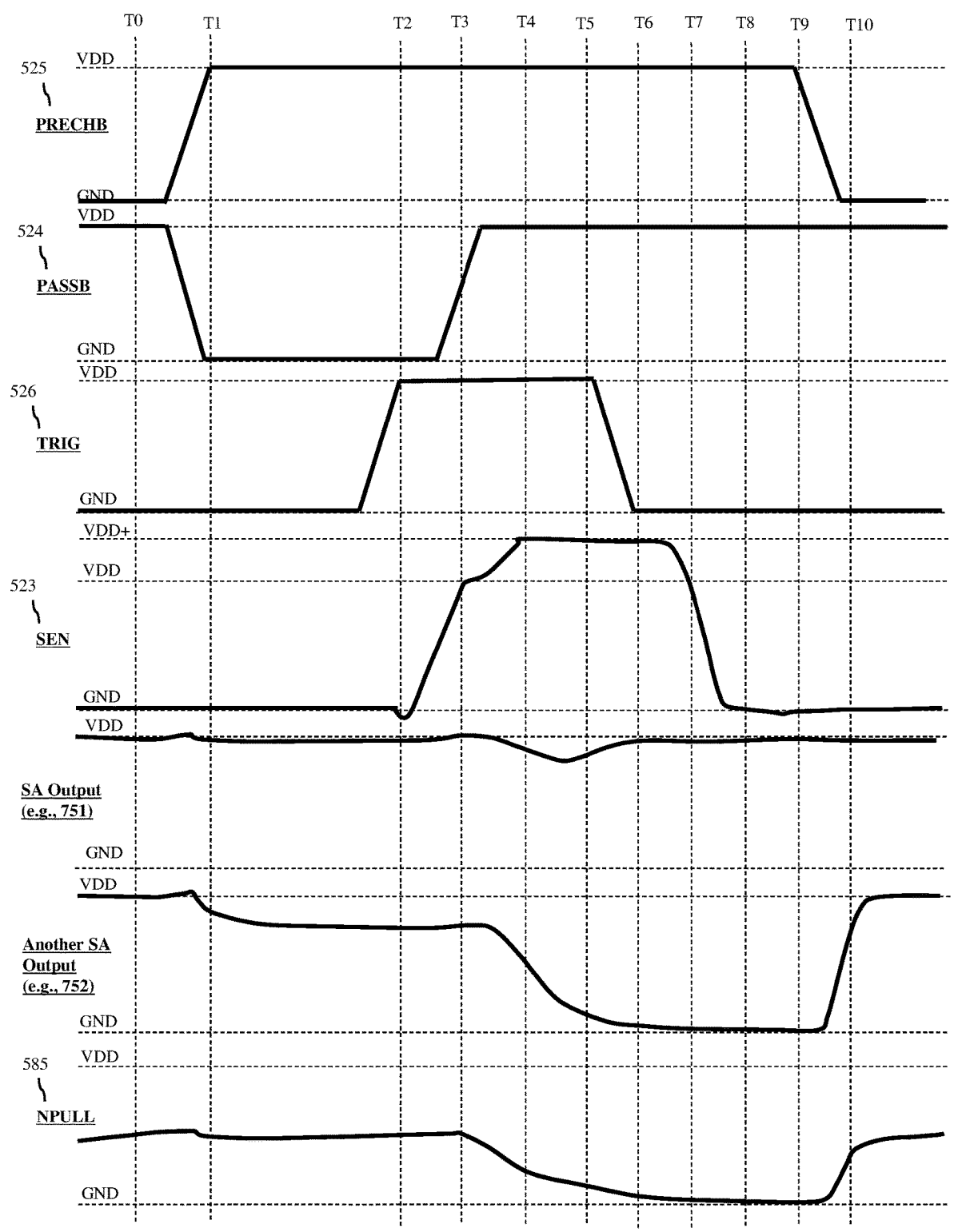
FIG. 11 is a graph and, particularly, a timing diagram illustrating the states of signals within the sense circuit control block and each sense amplifier over time (e.g., during a pre-charge operation mode and subsequently during a read operation mode)

The low-leakage sense circuit 520.1, 520.2 can operate in a pre-charge operation mode or a read operation mode. FIG. 11 is a graph illustrating the states of various signals within the sense circuit 520.1, 520.2 and, particularly, within the sense circuit control block 529.1, 529.2 and each sense amplifier 521A-N over time (e.g., during a pre-charge operation mode and subsequently during a read operation mode).

Specifically, during a pre-charge operation mode at time T0 or T10, PRECHB 525 can be at a first or low voltage level (e.g., at GND) so that, within each sense amplifier 521A-N (e.g., as shown in FIG. 7) the three pre-charge transistors 741-743 in the pre-charge sub-circuit 740 are turned on, thereby pre-charging the first output node 751 and the second output node 752. Additionally, PASSB 524 can be at a second voltage level (e.g., at VDD), which is higher than the first voltage level, so that, within each sense amplifier 521A-N (e.g., as shown in FIG. 7), the first and second access transistors 731-732 of each sense amplifier 521A-N are turned off. Furthermore, within the SSG&B circuit 527 (e.g., as shown in FIG. 9), TRIG 526 will be at the first voltage level so that DL1 921 is at the second voltage level and, thus, so that the NFET 904 is turned on and pulls down the voltage level on the output node 905. Since the voltage level on the output node 905 of the SSG&B circuit 527 controls the on and off states of the common footer device 580 (which is an NFET 581, as shown in FIG. 8A, or a group of stacked NFETs 581a-581b, as shown in FIG. 8B), the common footer device 580 will be turned off. Thus, the voltage level on the common voltage pull-down line 585 connected to each of the sense amplifiers 521A-N and thereby the voltage levels on the pull-down nodes 785 (NPULL) within each of the sense amplifiers 521A-N will not be pulled down but instead will be steady at approximately half-way between the first voltage level (e.g., GND) and the second voltage level (e.g., VDD). Since the only leakage current paths are through the common footer device 580 and not through any built-in footer devices within the sense amplifiers 521A-N, an almost forty times reduction in sense circuit leakage can be achieved with this configuration.

A read operation mode occurs between time T1 and time T9. Specifically, at time T1 PRECHB 525 switches to the second voltage level (e.g., VDD) and PASSB switches back to the first voltage level (e.g., GND). As a result, within each sense amplifier 521A-N (e.g., as illustrated in FIG. 7), the pre-charge transistors 741-743 are turned off and the access transistors 731-732 are turned on so that, for each sense amplifier 521A-N, the voltage signals on BLT 531 and BLC 532 can be received as inputs.

At time T2, TRIG 526 switches from the first voltage level (e.g., GND, logic "0") to the second voltage level (e.g., VDD, logic "1").

Referring to the SSG&B circuit 527 (e.g., as illustrated in FIG. 9) in combination with FIG. 11, in the first clock cycle after TRIG 526 switches to the second voltage level (e.g., VDD, logic "1"), the first inverter 911, which receives TRIG 526 will switch DL1 from the second voltage level back to the first voltage level (i.e., to GND, logic "0"). Additionally, in the first clock cycle after TRIG 526 switches to the second voltage level (e.g., VDD, logic "1"), the SPU 925 output of the NAND gate 901 will switch to the first voltage level (e.g., to VDD, logic "1") because, at this point in time, both of the inputs (TRIG 526 and DL3 923) to the NAND gate 901 are at the second voltage level (e.g., VDD, logic "1").

In the second clock cycle after TRIG 526 switches to the second voltage level (e.g., VDD, logic "1"), SPU 925 will be at the first voltage level (e.g., GND, logic "0") and, thus, will turn on the PFET 902 so that the voltage level on the output node 905 and thereby the voltage level of SEN 523 is pulled up to the second voltage level (e.g., to VDD, logic "1") (see time T3). Additionally, the second inverter 912 in the delay circuit 910 receives the switched DL1 921 and outputs a switched DL2 921 (i.e., DL2 921 switches to VDD, logic "1").

In the third clock cycle after TRIG 526 switches to the second voltage level (e.g., VDD, logic "1"), the third inverter 913 receives the switched DL2 922 (which is at the second voltage level) and outputs a switched DL3 923 (i.e., DL3 switches to GND, logic "0").

In the fourth clock cycle after TRIG 526 switches to the second voltage level (e.g., VDD, logic "1"), the NAND gate 901 switches SPU 925 back to the second voltage level because, at this point in time, TRIG 526 is at a logic "1", but DL3 923 is now at a logic "0". Additionally, the fourth inverter 914 receives the switched DL3 (which as mentioned above is now at a logic "0") and outputs a switched DL4 (i.e., DL4 switches to VDD). That is, at time T5, DL4 is at the second voltage level (e.g., at VDD) and, thus, charges the coupling capacitor 903, which in turn boosts the voltage level of SEN 523 from the second voltage level (e.g., VDD) to a third voltage level (e.g., VDD+), which is higher than the second voltage level (e.g., by 100 mV or more, e.g., by approximately 125 mV) (see time T4). For example, in some embodiments, the second voltage level (e.g., VDD) can be approximately 0.45V and the third voltage level (e.g., VDD+) can be approximately 0.55V or more (e.g., approximately 0.6V).

Referring again to the sense amplifier 521 (e.g., as illustrated in FIG. 7) in combination with FIG. 11, during the read operation mode at time T3 when the common footer device 580 is turned on but the voltage level on the gate of the common footer device 580 (i.e., the voltage level of SEN 523) is only at the second voltage level (e.g., at VDD), the common footer device 580 does not have sufficient drive current to, within each sense amplifier, pull down the voltage level on one of the output nodes 751 or 752 through the pull-down node 785, the common voltage pull-down line 585 (NPULL), and the common footer device 580 in order to enable detection by the voltage differential signal on the complementary bitline pair. Only after the voltage level of SEN 523 is boosted to the third voltage level (e.g., to VDD+) is there sufficient pull down strength through the pull-down node 785, the common voltage pull-down line 585 and the common footer device 580 (see times T4 to T7).

Specifically, during the read operation mode at time T4, the first and second output nodes 751 and 752 will both be at or near the second voltage level (e.g., VDD) due to the previous pre-charging operation. As mentioned above, with regard to the exemplary 6T-SRAM cell 501 in FIG. 6, during the read operation mode, when a data value of "1" is stored on the first data node 605, BLT 531 will remain charged at its pre-charge voltage level and the voltage level on BLC 532 will be pulled down through the second pass-gate transistor 614 and the second pull-down transistor 613 and vice versa. The sense amplifier 521 is employed to detect and amplify the differential signal (which may be relatively weak). Once detected and amplified the differential signal can captured by a latch 522.

For example, consider the case where a data value of "1" is stored on the first data node, BLT 531 will have a higher voltage level than BLC 532. With a sense amplifier 521 connected to complementary bitline pair (e.g., as illustrated in FIG. 7), the first pull-down transistor 711 will turn on and the first pull-up transistor 712 will turn off. Thus, the first pull-down transistor 711 will pull down (e.g., through the pull-down node 785, the common voltage pull-down line 585 and the common footer device 580) the voltage levels on the first cross-coupling node 713 and on the second output node 752. The low voltage level on the first cross-coupling node 713 will, in turn, ensure that the second pull-down transistor 721 remains off and the second pull-up transistor 722 is turned on. The boost to SEN 523 ensures that there is enough drive strength to keep the low voltage level on the first cross-coupling node 713. Thus, the second pull-up transistor 722 will pull up the voltage levels on the second cross-coupling node 723 and on the first output node 751 (e.g., through the pull-up node 786)._That is, the voltage level on the first output node 751 will remain at the second voltage level (e.g., VDD) indicating the stored data value of "1" and the voltage level on the second output node 752 will be pulled down to the first voltage level (e.g., GND) (see time T7).

A latch 522, which has first and second input nodes connected to the first and second output nodes 751-752 of the sense amplifier 521 can capture the voltage differential and output an output signal (Q) that indicates the stored data value read from the memory cell. Various configurations for such latches are well known in the art and, thus, the details thereof have been omitted from this specification in order to allow the reader to focus on the salient aspects of the disclosed embodiments.

It should be noted that at times T5-T6, TRIG 526 can switch back to the second voltage level (e.g., to GND). Over the next four clock cycles, the delay circuit 910 can, in sequence, switch the delay signals (DL1, DL2, DL3, and DL4) to reset SEN 523 back to the first voltage level and turn off the common footer device 580 (see times T7-T8).

Then, at times T9-T10, PRECHB 525 can switch back to the first voltage level (e.g., to GND) and the pre-charge operation mode can be repeated in order to pre-charge the voltage levels on the first output node 751 and the second output node 752 to the second voltage level (e.g., to VDD). As illustrated, the voltage level on the pull-down node 785 is also pulled up to approximately half-way between the first voltage level (e.g., GND) and the second voltage level (e.g., VDD).

As mentioned above and illustrated in FIG. 5A, in the sense circuit 520.1, the pull-up node 786 of each of the sense amplifiers 521A-N can be directly connected to a positive voltage supply rail 540. Alternatively, as mentioned above and illustrated in FIG. 5B, in the sense circuit 520.2, the pull-up node 786 of each of the sense amplifiers 521A-N can be connected to a common voltage pull-up line 541. In this case, the sense circuit control block 529.2 can also include a common header device 570. That is, instead of being directly connected to the positive voltage supply rail 540, each sense amplifier 721A-N can be connected to the positive voltage supply rail 540 through the common header device 570 in the sense circuit control block 529.2. Such a common header device 570 can be controlled by a sleep mode control signal (LSB) 573 from the controller 595. When the memory circuit 500.2 is in an idle mode for an extended period of time and enters a light sleep mode, LSB can switch to logic "1", thereby turning off the common header device 570 and concurrently blocking any leakage current path through the sense amplifiers.

In the above-described embodiments, by using the common footer device 580 in combination with the SSG&B circuit 527 (instead of leaky built-in footer devices within the sense amplifiers), leakage from the sense circuit 520.1, 520.2 during a pre-charge operation mode is significantly reduced without sacrificing performance during a read operation mode. Optionally, by using a common header device 570, a positive voltage supplied to the sense amplifiers 521A-N can be selectively turned off (e.g., in response to a sleep mode control signal during a sleep mode) in order to further reduce leakage from the sense circuit 520.2. Thus, the disclosed low-leakage sense circuit 520.1, 520.2 reduces the sense circuit leakage contribution to the total memory circuit leakage of a memory circuit 500.1, 500.2 that incorporates the low-leakage sense circuit.

Figure 12:
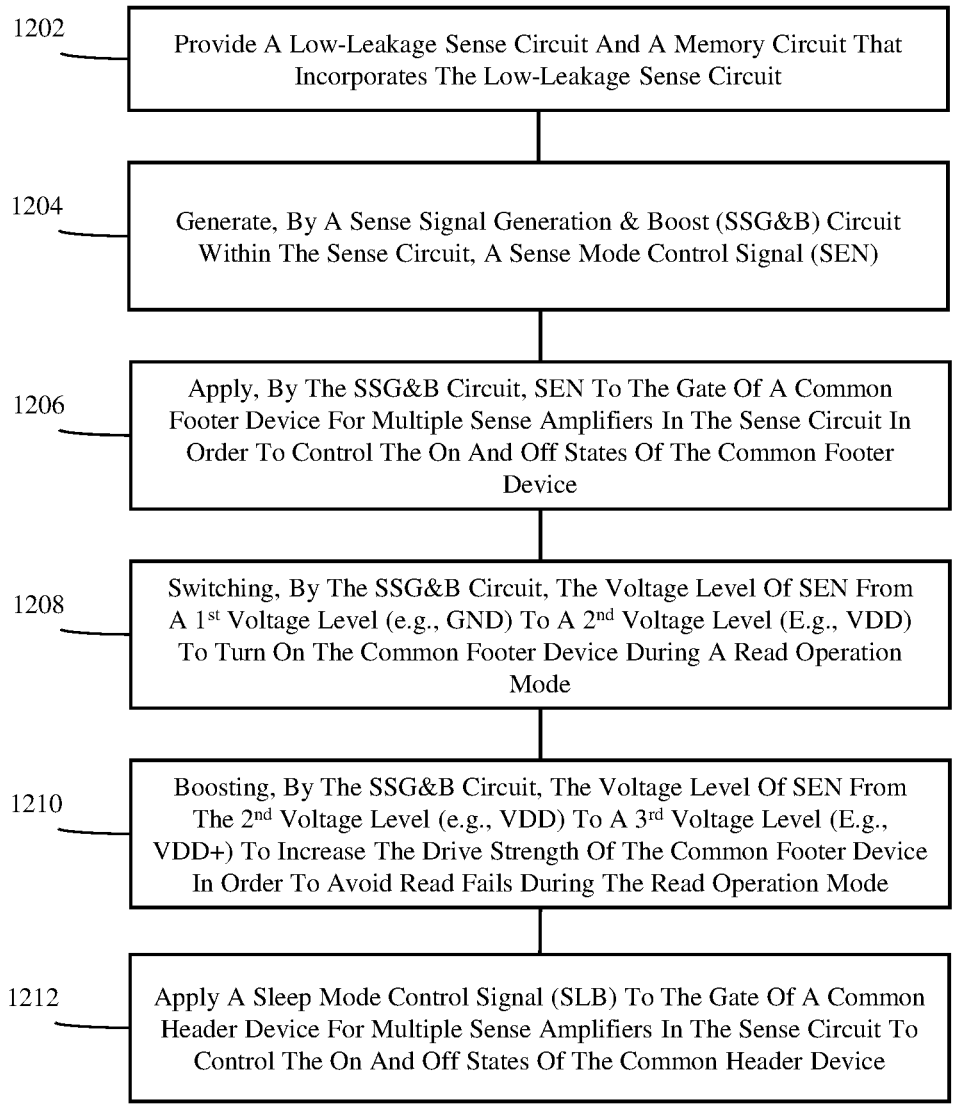
FIG. 12 is a flow diagram illustrating disclosed method embodiments for operating the disclosed memory circuit and sense circuit embodiments.

Referring to the flow diagram of FIG. 12, also disclosed herein are method embodiments for operating the structures.

The method can include providing a low-leakage sense circuit (e.g., the low-leakage sense circuit 520.1 in FIG. 5A or 520.2 in FIG. 5B, described in detail above) and a memory circuit (e.g., the memory circuit 500.1 of FIG. 5A or memory circuit 500.2 of FIG. 5B, described in detail above), which incorporates the low-leakage sense circuit 520.1, 520.2 (see process step 1202).

The method can further include generating, by a sense signal generation and boost (SSG&B) circuit 527 in a sense circuit control block 529.1, 529.2 of the sense circuit 520.1, 520.2, a sense mode control signal (SEN) 523 (see process step 1204). This SEN 523 can be generated based on a sense mode trigger signal (TRIG) 526.

The method can further include applying, by the SSG&B circuit 527, the SEN 523 to the gate of a common footer device 580, which is within the sense circuit control block 529.1, 529.2, and which is connected by a common voltage pull-down line 585 to pull-down nodes in each of the sense amplifiers 521A-N (see process step 1206). Application of SEN 523 to the gate of the common footer device 580 can be employed to control the on and off states of the common footer device 580.

When SEN 523 is at a first voltage level (e.g., GND), the common footer device 580 can be turned off (e.g., during a pre-charge operation mode in the sense amplifiers). Since there is only one common footer device 580, leakage from the sense circuit during the pre-charge operation mode is significantly reduced.

When SEN 523 is switched to a second voltage level (e.g., VDD), the common footer device 580 can be turned on (e.g., during a read operation mode in the sense amplifiers). That is, the method can further include switching, by the SSG&B circuit 527, SEN 523 from the first voltage level (e.g., GND) to the second voltage level (e.g., VDD) during a read operation mode based on the voltage level of TRIG 526 in order to turn on the common footer device 580 (see process step 1208). However, as discussed above with regard to FIG. 7 and FIG. 11, during the read operation mode at time T3 when the common footer device 580 is turned on but the voltage level on the gate of the common footer device 580 (i.e., the voltage level of SEN 523) is only at the second voltage level (e.g., at VDD), the common footer device 580 may not have sufficient drive current so that, within each sense amplifier 521A-N, the voltage on one of the first and second output nodes 751 or 752 is sufficiently pulled down, through the pull-down node 785, the common voltage pull-down line 585 (NPULL), and the common footer device 580, to enable detection of the voltage differential signal on the complementary bitline pair.

Therefore, the method can further include boosting, by the SSG&B circuit 527, the SEN 523 from the second voltage level (e.g., VDD) to a third voltage level (e.g., VDD+), which is greater than the second voltage level, when the common footer device 580 is turned on in order to increase the drive current of the common footer device 580 during a read operation mode (see process step 1210). Boosting SEN 523 to increase the drive current of the common footer device 580 is performed at process step 1210 so that, during the read operation mode within each sense amplifier 521A-N, the voltage level on one of the first and second output nodes 751 and 752 is sufficiently pulled down through the pull-down node 785, the common voltage pull-down line 585 and the common footer device 580 in order to enable detection of the voltage differential in the complementary bitline pair and, thereby avoid a read fail.

Optionally, in the low-leakage sense circuit 520.2 (see FIG. 5B) provided at process step 1202, the pull-up nodes 786 of the sense amplifiers 521A-N can be electrically connected to a common voltage pull-up line 541 and this common voltage pull-up line 541 can be electrically connected to a common header device 570 within the sense circuit control block 529.2. In this case, the method can further include applying a sleep mode control signal (LSB) 573 (e.g., from the controller 595) to the gate of the common header device 570 to control the on and off states of the header device (see process step 1212). When the memory circuit 500.2 is in an idle mode for an extended period of time and enters a light sleep mode, LSB can be switched to logic "1", thereby turning off the common header device 570 and concurrently blocking any leakage current path through the sense amplifiers.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    sense amplifiers comprising pull-down nodes, respectively;
    a footer device for the sense amplifiers, wherein the footer device comprises: a source region connected to a ground rail; a drain region connected to each of the pull-down nodes; and a gate; and
    a sense signal generation and boost circuit having an output node connected to the gate of the footer device, wherein the sense signal generation and boost circuit generates a sense mode control signal on the output node to control on and off states of the footer device and further boosts the sense mode control signal when the footer device is in an on-state in order to increase a drive current of the footer device.

2. The structure of claim 1, wherein the sense signal generation and boost circuit comprises:
    an input node receiving a sense mode trigger signal;
    a delay circuit comprising four series-connected inverter delay elements comprising: a first inverter that receives the sense mode trigger signal and outputs a first delay signal; a second inverter that receives the first delay signal and outputs a second delay signal; a third inverter that receives the second delay signal and outputs a third delay signal; and a fourth inverter that receives the third delay signal and outputs a fourth delay signal;
    a capacitor, wherein the delay circuit and the capacitor are connected in series between the input node and the output node;
    a NAND gate receiving the sense mode trigger signal and the third delay signal and outputting a sense pull-up signal; and
    a p-type transistor and an n-type transistor connected in series between a positive voltage supply rail and a ground rail, wherein the sense pull-up signal is applied to the gate of the p-type transistor, wherein the first delay signal is applied by the first inverter to a gate of the n-type transistor, and wherein the output node is at a junction between the p-type transistor and the n-type transistor and outputs the sense mode control signal to the gate of the footer device.

3. The structure of claim 2, wherein, when the sense mode trigger signal is at a first voltage level and the first delay signal is at a second voltage level that is greater than the first voltage level, the n-type transistor turns on such that the sense mode control signal on the output node is pulled down to the first voltage level and the footer device is turned off.

4. The structure of claim 3, wherein, when the sense mode trigger signal switches from the first voltage level to the second voltage level, the first delay signal switches from the second voltage level to the first voltage level and the n-type transistor turns off.

5. The structure of claim 4, wherein, when the sense mode trigger signal switches from the first voltage level to the second voltage level, switching of the third delay signal from the second voltage level to the first voltage level is delayed for a period of time such that both inputs to the NAND gate are at the second voltage level causing the sense pull-up signal to switch to the first voltage level, the p-type transistor to turn on, and the sense mode control signal on the output node to be pulled up to the second voltage level.

6. The structure of claim 5,
wherein, when the third delay signal switches from the second voltage level to the first voltage level, the sense pull-up signal switches back to the second voltage level and the fourth delay signal switches from the first voltage level to the second voltage level, and
wherein, when the fourth delay signal switches to the second voltage level, the capacitor is charged and the sense mode control signal is boosted to a third voltage level that is greater than the second voltage level.

7. The structure of claim 1, further comprising:
a memory array comprising memory cells arranged in columns and rows;
pairs of bitlines for the columns, wherein all memory cells in a column of memory cells are connected to the bitlines of a pair of bitlines for the column and wherein the bitlines for the pair of bitlines for the column are connected to a sense amplifier for the column; and
latches connected to the sense amplifiers, respectively.

8. A structure comprising:
sense amplifiers comprising pull-up nodes, respectively, wherein the sense amplifiers further comprise pull-down nodes, respectively;
a footer device for the sense amplifiers, wherein the footer device comprises: a first source region connected to a ground rail; a first drain region connected to each of the pull-down nodes; and a first gate;
a header device for the sense amplifiers, wherein the header device comprises: a second source region connected to a positive voltage supply rail; a second drain region connected to each of the pull-up nodes such that the sense amplifiers are connected in parallel between the footer device and the header device; and a second gate; and
a sense signal generation and boost circuit having an output node connected to the first gate of the footer device,
wherein the sense signal generation and boost circuit generates a sense mode control signal on the output node to control on and off states of the footer device and further boosts the sense mode control signal when the footer device is in an on-state in order to increase a drive current of the footer device, and
wherein a sleep mode control signal is applied to the second gate to control on and off states of the header device.

9. The structure of claim 8, wherein the sense signal generation and boost circuit comprises:
an input node receiving a sense mode trigger signal;
a delay circuit comprising four series-connected inverter delay elements comprising: a first inverter that receives the sense mode trigger signal and outputs a first delay signal; a second inverter that receives the first delay signal and outputs a second delay signal; a third inverter that receives the second delay signal and outputs a third delay signal; and a fourth inverter that receives the third delay signal and outputs a fourth delay signal;
a capacitor, wherein the delay circuit and the capacitor are connected in series between the input node and the output node;
a NAND gate receiving the sense mode trigger signal and the third delay signal and outputting a sense pull-up signal; and
a p-type transistor and an n-type transistor connected in series between a positive voltage supply rail and a ground rail, wherein the sense pull-up signal is applied to the gate of the p-type transistor, wherein the first delay signal is applied by the first inverter to a gate of the n-type transistor, and wherein the output node is at a junction between the p-type transistor and the n-type transistor and outputs the sense mode control signal to the gate of the footer device.

10. The structure of claim 9, wherein, when the sense mode trigger signal is at a first voltage level and the first delay signal is at a second voltage level that is greater than the first voltage level, the n-type transistor turns on such that the sense mode control signal on the output node is pulled down to the first voltage level and the footer device is turned off.

11. The structure of claim 10, wherein, when the sense mode trigger signal switches from the first voltage level to the second voltage level, the first delay signal switches from the second voltage level to the first voltage level and the n-type transistor turns off.

12. The structure of claim 11,
wherein, when the sense mode trigger signal switches from the first voltage level to the second voltage level, switching of the third delay signal from the second voltage level to the first voltage level is delayed for a period of time such that both inputs to the NAND gate are at the second voltage level causing the sense pull-up signal to switch to the first voltage level, the p-type transistor to turn on, and the sense mode control signal on the output node to be pulled up to the second voltage level,
wherein, when the third delay signal switches from the second voltage level to the first voltage level, the sense pull-up signal switches back to the second voltage level and the fourth delay signal switches from the first voltage level to the second voltage level, and
wherein, when the fourth delay signal switches to the second voltage level, the capacitor is charged and the sense mode control signal is boosted to a third voltage level that is greater than the second voltage level.

13. A method comprising:
providing a sense circuit comprising:
sense amplifiers comprising pull-down nodes, respectively;
a footer device for the sense amplifiers comprising: a source region connected to a ground rail; a drain region connected to each of the pull-down nodes; and a gate; and
a sense signal generation and boost circuit having an output node connected to the gate of the footer device;
generating, by the sense signal generation and boost circuit, a sense mode control signal;

applying, by the sense signal generation and boost circuit, the sense mode control signal to the gate of the footer device to control on and off states of the footer device,
  wherein, when the sense mode control signal switches to a first voltage level, the footer device turns off and leakage current through the sense amplifiers is minimized, and
  wherein, when the sense mode control signal switches to a second voltage level that is greater than the first voltage level, the footer device turns on; and
boosting, by the sense signal generation and boost circuit, the sense mode control signal to a third voltage level that is greater than the second voltage level when the footer device is turned on.

14. The method of claim 13, wherein the boosting of the sense mode control signal increases a drive current of the footer device to pull down voltage levels on pull-down nodes in all of the sense amplifiers.

15. The method of claim 13,
  wherein the sense circuit further comprises a header device comprising: a second source region connected to a positive voltage supply rail; a second drain region connected to each of the sense amplifiers such that the sense amplifiers are connected in parallel between the footer device and the header device; and a second gate, and
  wherein the method further comprises applying a sleep mode control signal to the second gate to control on and off states of the header device.

\* \* \* \* \*